(12) United States Patent
Kitamura

(10) Patent No.: US 7,701,989 B2
(45) Date of Patent: Apr. 20, 2010

(54) LASER DIODE DRIVING APPARATUS

(75) Inventor: Kanji Kitamura, Kyoto (JP)

(73) Assignee: Panasonic Corporation, Osaka (JP)

( * ) Notice: Subject to any disclaimer, the term of this patent is extended or adjusted under 35 U.S.C. 154(b) by 198 days.

(21) Appl. No.: 11/758,256

(22) Filed: Jun. 5, 2007

(65) Prior Publication Data

US 2007/0280316 A1    Dec. 6, 2007

(30) Foreign Application Priority Data

Jun. 5, 2006    (JP)    ............................. 2006-155760

(51) Int. Cl.
*H01S 3/00*    (2006.01)
(52) U.S. Cl. ................ 372/38.02; 372/38.1; 372/38.04; 372/38.07
(58) Field of Classification Search ................ 372/38.1, 372/38.01–38.09
See application file for complete search history.

(56) References Cited

U.S. PATENT DOCUMENTS

| | | | |
|---|---|---|---|
| 5,191,589 A | 3/1993 | Amano et al. | |
| 5,514,989 A | 5/1996 | Sato et al. | |
| 6,490,301 B1 | 12/2002 | Tatehara et al. | |
| 6,661,817 B1 * | 12/2003 | Ames et al. ............. | 372/29.021 |
| 6,717,968 B2 | 4/2004 | Tatehara et al. | |
| 7,046,706 B2 | 5/2006 | Tatehara et al. | |
| 7,064,696 B2 | 6/2006 | Ohkubo et al. | |
| 2005/0030871 A1 * | 2/2005 | Kato et al. ............... | 369/59.11 |
| 2005/0281162 A1 * | 12/2005 | Nagaoka et al. .......... | 369/53.12 |
| 2006/0023760 A1 * | 2/2006 | Kim et al. ................ | 372/38.02 |

FOREIGN PATENT DOCUMENTS

| | | |
|---|---|---|
| JP | 07-095610 | 8/1992 |
| JP | 05-021877 | 1/1993 |
| JP | 06-140700 | 5/1994 |
| JP | 06-196746 | 7/1994 |
| JP | 08-037331 | 2/1996 |
| JP | 2004-110975 | 4/2004 |
| JP | 2004-288842 | 10/2004 |
| JP | 2004-342657 | 12/2004 |

* cited by examiner

*Primary Examiner*—Minsun Harvey
*Assistant Examiner*—Xnning Niu
(74) *Attorney, Agent, or Firm*—RatnerPrestia

(57) ABSTRACT

A laser diode driving apparatus comprising an oscillator (11) for generating a high-frequency signal; an amplifier (12) for amplifying the high-frequency signal and outputting the amplified high-frequency signal; current mirror circuits (7, 8 and 9) for receiving the output current of the amplifier (12) and driving multiple laser diodes (1, 2 and 3), respectively; a DC current supply source (10) for supplying a DC current to the current mirror circuits, wherein the laser diode is driven using a current obtained by superimposing the high-frequency signal on the DC current, the laser diode driving apparatus further comprising a high-frequency signal superimposed amplitude setting circuit (14) for changing the amplitude of the amplifier so as to be suited for the selection of the current mirror circuit.

8 Claims, 9 Drawing Sheets

AMPLITUDE CHARACTERISTIC OF HIGH-FREQUENCY SUPERIMPOSED CURRENT, OF WHICH INCLINATION BEING SET USING EXTERNAL RESISTOR

LASER DIODE DRIVING APPARATUS

BACKGROUND OF THE INVENTION

The present invention relates to a laser diode driving apparatus for driving multiple laser diodes in an optical disc recording/reproducing apparatus or the like.

In recent years, recording media for use in optical disc recording/reproducing apparatuses are getting diversified depending on usage. In addition to CD and DVD, BD (Blu-ray Disc) and HD-DVD (High-Definition DVD) are being used increasingly. For the purpose of dealing with various kinds of recording media, it is necessary to use laser diodes for outputting light having wavelengths suited for respective recording media. Hence, multiple laser diodes are mounted in an optical disc recording/reproducing apparatus capable of dealing with multiple kinds of recording media. Generally, multiple laser diodes are driven by a single laser diode driving apparatus.

In the reproduction mode of a conventional optical disc recording/reproducing apparatus, there is a problem of the so-called optical feedback noise. The optical feedback noise occurs when the light applied from a laser diode to a recording medium in the reproduction mode is reflected by the recording medium and part of the reflected light returns to the laser diode, thereby hindering stable oscillation of the laser diode. Generally, a high-frequency signal having a frequency of several hundred MHz is superimposed in the reproduction mode, and the laser diode is driven, whereby the laser diode usually being oscillated in a single mode is oscillated in a multi mode, thereby solving the problem of the optical feedback noise.

In addition, the magnitude of the amplitude of the high-frequency superimposed current that is used in the reproduction mode changes significantly depending on the junction capacitance and the differential resistance of the laser diode to be driven, and the characteristics of other optical pickup components, such as the impedance of the transmission path from the laser diode driving apparatus to the laser diode. Furthermore, the frequency of the high-frequency superimposed current that is used in the reproduction mode is generally several hundred MHz. The higher harmonics of the high-frequency superimposed current may jeopardize EMI (electromagnetic interface), that is a standard of the electromagnetic interference. Conventionally, the amplitude of the high-frequency superimposed current is set using an external amplitude adjusting resistor. Japanese Patent Application Laid-open Publication No. 2004-342657 is taken as a conventional example in which such an external amplitude adjusting resistor is disclosed. FIG. 11 is a characteristic graph showing the relationship between the amplitude [mApp] of the high-frequency superimposed current described above and the resistance value [Ω] of the amplitude adjusting resistor. As shown in the characteristic graph of FIG. 11, it can be understood the amplitude of the high-frequency superimposed current decreases (I1→I2→I3) as the resistance value of the amplitude adjusting resistor is changed (R1→R2→R3).

However, as described above, the setting of the high-frequency superimposed current changes significantly depending on the junction capacitance and the differential resistance of the laser diode to be driven, and the characteristics of other optical pickup components, such as the impedance of the transmission path from the laser diode driving apparatus to the laser diode. In the method for setting the amplitude of the high-frequency superimposed current using the external amplitude adjusting resistor (Japanese Patent Application Laid-open Publication No. 2004-342657), there is a problem that the number of external components increases as the number of laser diodes increases.

The characteristics of laser diodes being used for optical disc recording/reproducing apparatuses have large variations among manufacturers. Japanese Patent Application Laid-open Publication No. 2004-288842 and Japanese Patent Application Laid-open Publication No. 2004-110975 disclose apparatuses in which the amplitude of the high-frequency superimposed current is set using an adjusting circuit incorporated therein. However, when the amplitude of the high-frequency superimposed current is set using the adjusting circuit incorporated inside the apparatus, there is a problem that the range of changing the setting is limited in comparison with the change in the characteristics of the laser diode.

SUMMARY OF THE INVENTION

The present invention is intended to solve the problems encountered in the conventional laser diode driving apparatuses, and an object of the present invention is to provide a laser diode driving apparatus capable of carrying out a wide range of setting suited for the characteristics of the optical pickup components disposed in the vicinity of the laser diode driving apparatus and capable of setting a proper high-frequency superimposed current amplitude.

A laser diode driving apparatus according to a first aspect of the present invention comprises an oscillator for generating a high-frequency signal; an amplifier for receiving the high-frequency signal; current mirror circuits for receiving the output of the amplifier and driving respective multiple laser diodes; a DC current supply source for supplying a DC current to the current mirror circuits; a high-frequency superimposed current amplitude setting circuit for changing the amplitude of the amplifier so as to be suited for the selected current mirror circuit; and a controller for controlling the high-frequency superimposed current amplitude setting circuit, wherein the laser diode is driven using a current obtained by superimposing the high-frequency signal on the DC current. The laser diode driving apparatus configured as described above is capable of carrying out a wide range of setting suited for the characteristics of the optical pickup components disposed in the vicinity of the laser diode driving apparatus and capable of setting a proper high-frequency superimposed current amplitude.

A laser diode driving apparatus according to a second aspect of the present invention may have a configuration in which the high-frequency superimposed current amplitude setting circuit according to the first aspect is provided with a D/A converter that outputs a current for changing the amplitude of the amplifier, and the output current of the D/A converter is changed so as to be suited for the laser diode.

A laser diode driving apparatus according to a third aspect of the present invention may have a configuration in which the laser diode driving apparatus according to the second aspect is further provided with a controller, and the controller is used to change the output current of the D/A converter so as to be suited for the laser diode.

A laser diode driving apparatus according to a fourth aspect of the present invention may have a configuration in which the amplitude signal from the amplifier is superimposed on the DC current supplied from the DC current supply source in the current mirror circuit according to the first aspect to generate a high-frequency superimposed current, and the selected laser diode is driven using the generated high-frequency superimposed current.

A laser diode driving apparatus according to a fifth aspect of the present invention may have a configuration in which the high-frequency superimposed current amplitude setting circuit according to the first aspect comprises a reference voltage source; an operational amplifier for transmitting the reference voltage supplied from the reference voltage source; a MOS transistor for outputting a current obtained by converting the voltage transmitted from the operational amplifier; multiple selection switches being switched corresponding to the selected laser diode; internal loads respectively connected in series with the multiple selection switches; and a D/A converter operating by using the current being output from the MOS transistor as a reference current to output a current for changing the amplitude of the amplifier.

A laser diode driving apparatus according to a sixth aspect of the present invention may have a configuration in which the selection switch corresponding to the selected laser diode according to the fifth aspect is driven, and the reference voltage being input to the operational amplifier is V/I-converted into a current suited for the selected laser diode using an external load and the internal load driven by the selection switch.

A laser diode driving apparatus according to a seventh aspect of the present invention may have a configuration in which the inclination of the straight line indicating the high-frequency superimposed current amplitude characteristic according to the fifth aspect is changed using an external load.

A laser diode driving apparatus according to an eighth aspect of the present invention may have a configuration in which the bottom level of the straight line indicating the high-frequency superimposed current amplitude characteristic according to the fifth aspect is changed using an external load.

A laser diode driving apparatus according to a ninth aspect of the present invention may have a configuration in which the high-frequency superimposed current amplitude setting circuit according to the fifth aspect comprises multiple D/A converters, the output current of the D/A converter of the former stage is input so as to serve as the reference current of the D/A converter of the next stage, and the output of the D/A converter of the last stage is input to the amplifier.

A laser diode driving apparatus according to a 10th aspect of the present invention may have a configuration in which the high-frequency superimposed current amplitude setting circuit according to the first aspect comprises a reference current source; voltage converting means for converting the reference current supplied from the reference current source into a voltage suited for the selected laser diode; an operational amplifier to which the output of the voltage converting means is input; a MOS transistor for outputting a current obtained by converting the voltage transmitted from the operational amplifier; and a D/A converter operating by using the current being output from the MOS transistor as a reference current to change the amplitude of the amplifier.

A laser diode driving apparatus according to an 11th aspect of the present invention may have a configuration in which the high-frequency superimposed current amplitude setting circuit according to the first aspect comprises a reference current source; an operational amplifier to which a voltage obtained by converting the reference current supplied from the reference current source is input; a MOS transistor for outputting a current obtained by converting the voltage transmitted from the operational amplifier; a first D/A converter to which the current being output from the MOS transistor is input as a first reference current; and a second D/A converter to which the output of the first D/A converter is input as a second reference current, and the output of the second D/A converter is input to the amplifier.

As described above, the laser diode driving apparatus according to the present invention comprises an oscillator for generating a high-frequency signal; an amplifier for receiving the high-frequency signal; multiple current mirror circuits for receiving the output signal of the amplifier and respectively driving multiple laser diodes; a DC current supply source for supplying a DC current to the current mirror circuits; and a high-frequency superimposed current amplitude setting circuit for changing the amplitude of the amplifier so as to be suited for the selected current mirror circuit, and the selected laser diode is driven using the high-frequency superimposed current in which the high-frequency signal is superimposed on the DC current.

The high-frequency superimposed current amplitude setting circuit in the laser diode driving apparatus according to the present invention comprises a reference voltage source; an operational amplifier for transmitting the reference voltage of the reference voltage source; multiple selection switches being switched corresponding to the laser diode to be used; a MOS transistor for outputting a current obtained by converting the voltage transmitted from the operational amplifier; internal loads respectively connected in series with the multiple selection switches; and a D/A converter operating by using the current being output from the MOS transistor as a reference current. The D/A converter is controlled by the controller, and the high-frequency superimposed current amplitude is set by the D/A converter. With this configuration, the reference current of the D/A converter is switched so as to be suited for each of the laser diodes, whereby the setting range of the high-frequency superimposed current amplitude can be changed. In addition, the high-frequency superimposed current amplitude can be set as desired by controlling the D/A converter using the controller.

As described above, in order to set the high-frequency superimposed current amplitude, the laser diode driving apparatus according to the present invention comprises a D/A converter; selection switches for switching the reference current of the D/A converter; and a resistor for adjusting the high-frequency superimposed current amplitude, whereby the amplitude of the high-frequency superimposed current can be set so as to be suited for the junction capacitance and the differential resistance of each of multiple laser diodes, and the characteristics of other optical pickup components, such as the impedance of the transmission path from the laser diode driving apparatus to each of the multiple laser diodes. Furthermore, in the laser diode driving apparatus according to the present invention, external components can be simplified, and the number of the external components can be reduced significantly.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Preferred embodiments of the laser diode driving apparatus according to the present invention will be described below referring to the accompanying drawings.

Embodiment 1

Figure 1:
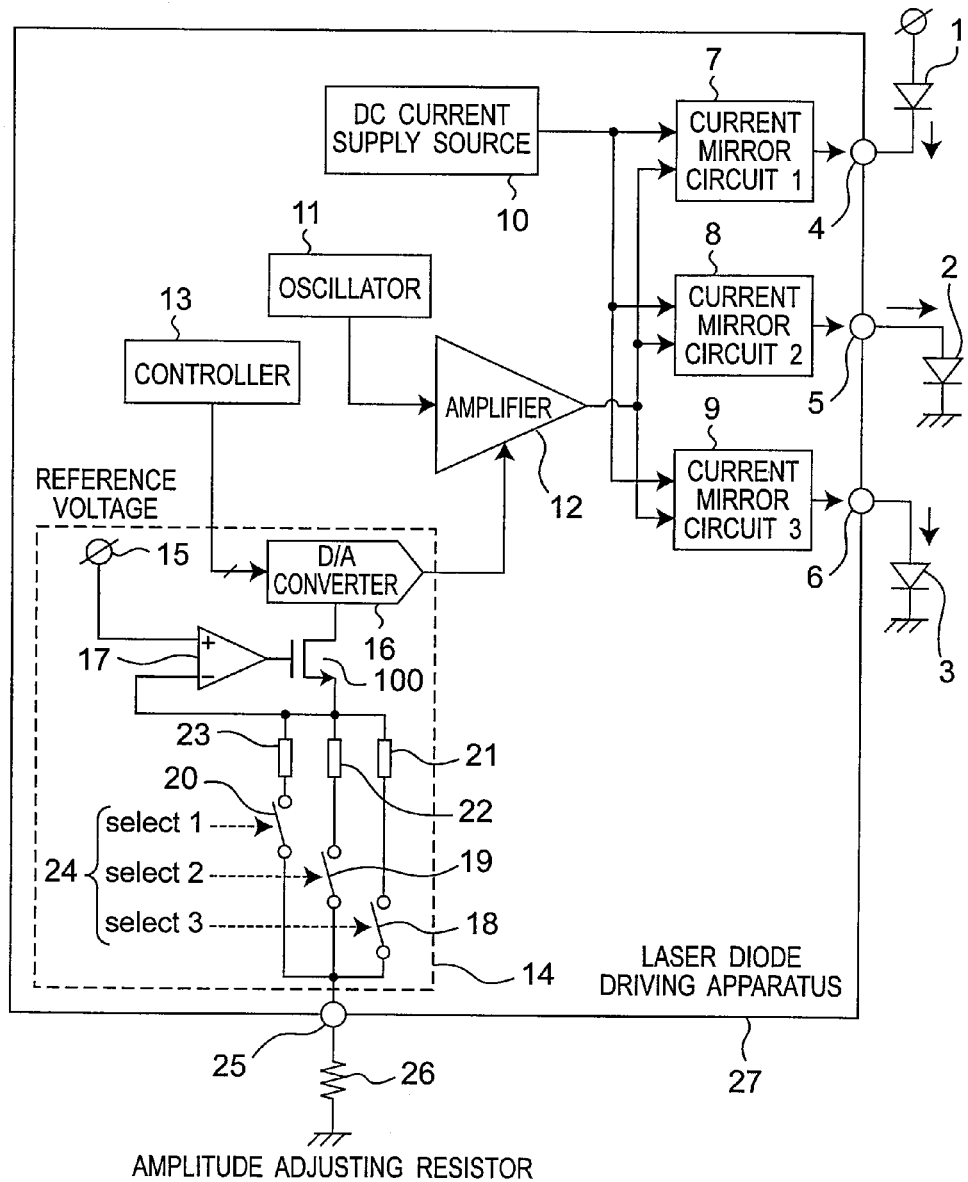
FIG. 1 is a circuit diagram showing the configuration of the laser diode driving apparatus according to Embodiment 1 of the present invention.
Figure 2:
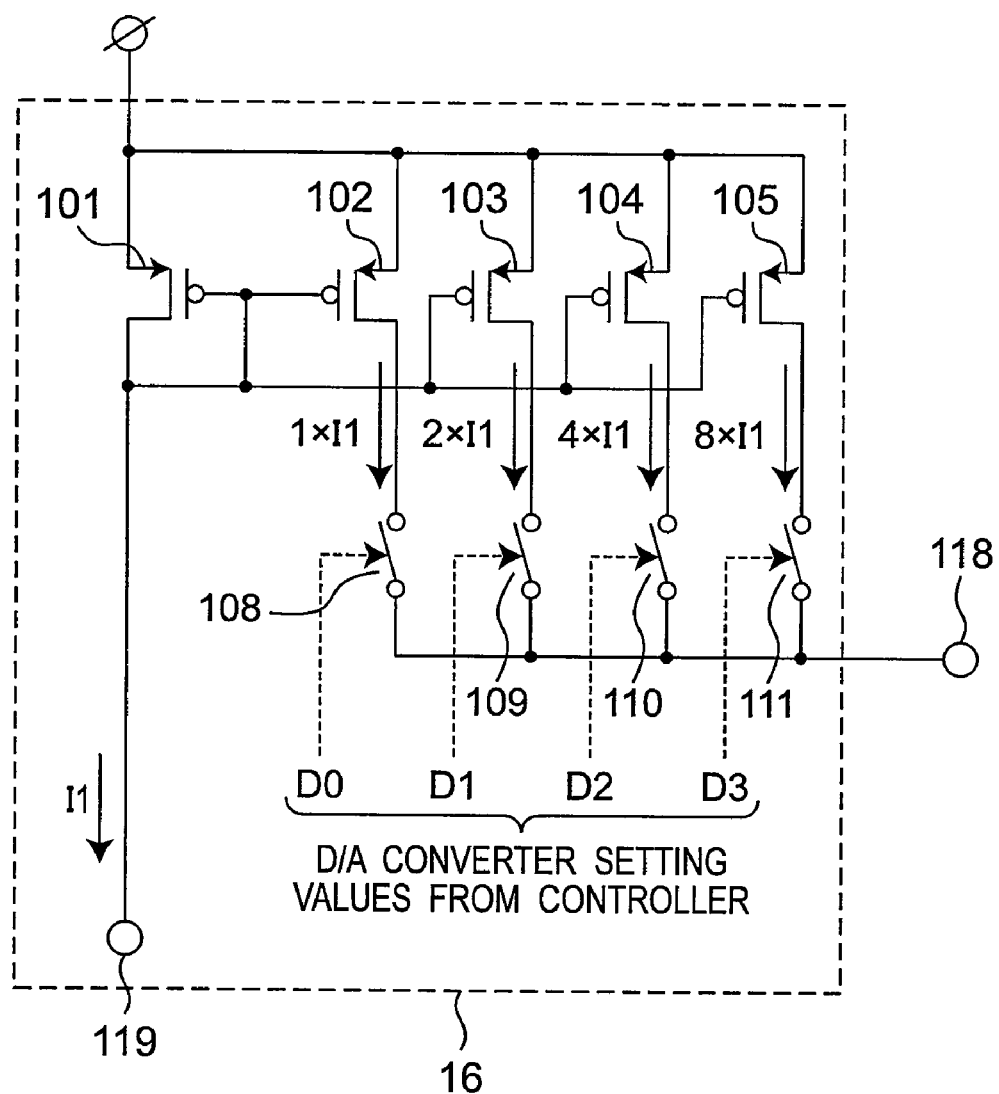
FIG. 2 is a circuit diagram showing a configuration of the D/A converter in the laser diode driving apparatus according to Embodiment 1.
Figure 3:
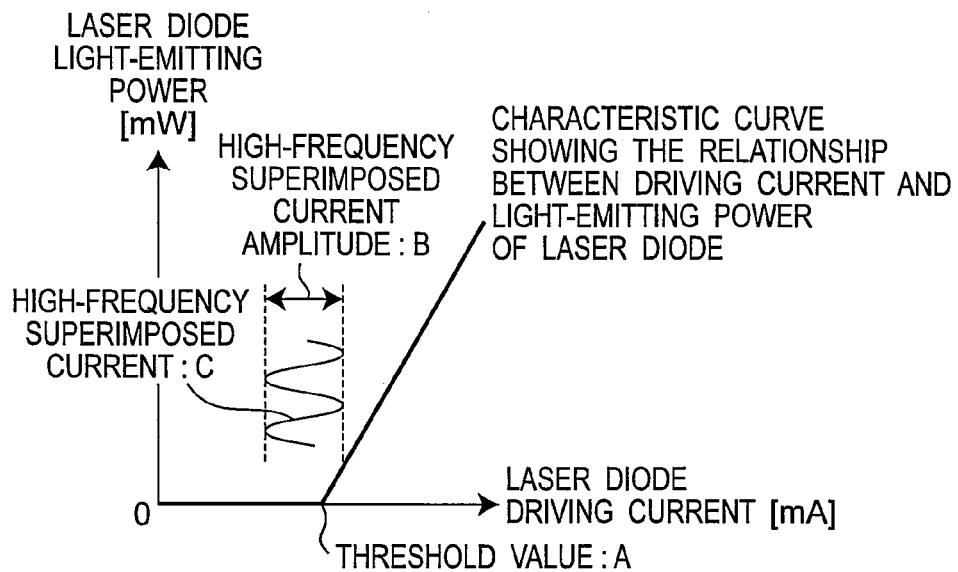
FIG. 3 is a characteristic graph showing an example of the relationship between the driving current and the light-emitting power of the laser diode according to Embodiment 1.
Figure 4:
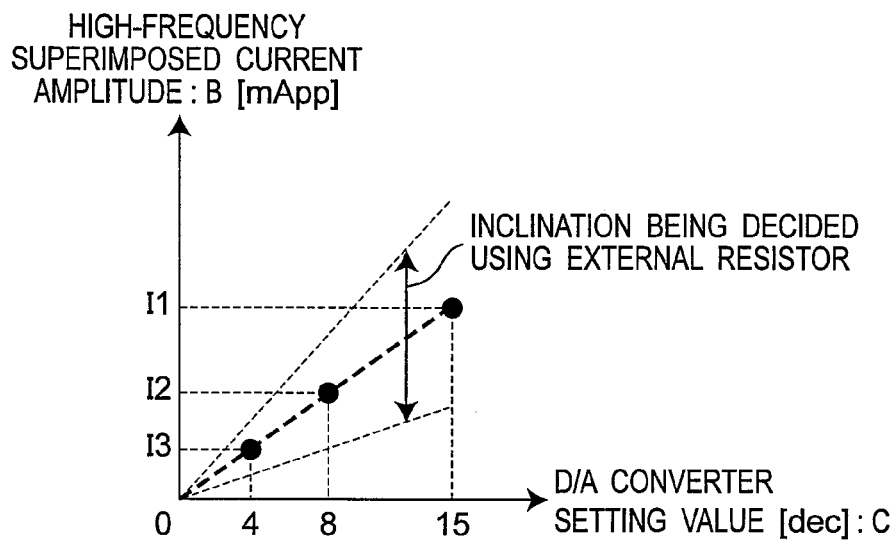
FIG. 4 is a graph showing the amplitude characteristic of the high-frequency superimposed current in the laser diode driving apparatus according to Embodiment 1.

A laser diode driving apparatus according to Embodiment 1 of the present invention will be described using FIGS. 1 to 6. FIG. 1 is a circuit diagram showing the configuration of the laser diode driving apparatus according to Embodiment 1. FIG. 2 is a circuit diagram showing a configuration of the D/A converter being used for the laser diode driving apparatus according to Embodiment 1. FIG. 3 is a characteristic graph showing an example of the relationship between the driving current and the light-emitting power of the laser diode according to Embodiment 1. FIG. 4 is a graph showing the amplitude characteristic of the high-frequency superimposed current in the laser diode driving apparatus according to Embodiment 1.

A laser diode driving apparatus 27 according to Embodiment 1 of the present invention is used for an optical disc recording/reproducing apparatus and is provided with three laser diodes 1, 2 and 3 so as to be suited for three kinds of recording media.

As shown in FIG. 1, the laser diode driving apparatus 27 according to Embodiment 1 comprises an oscillator 11 for generating a high-frequency signal; a high-frequency signal amplifier 12 for receiving and amplifying the high-frequency signal; three current mirror circuits 7, 8 and 9 for receiving the output signal of this high-frequency signal amplifier 12 and driving multiple laser diodes 1, 2 and 3, respectively; a DC current supply source 10 for supplying a DC current to the current mirror circuits 7, 8 and 9 so as to be suited for recording media; and a high-frequency superimposed current amplitude setting circuit 14 for changing the amplitude of the high-frequency signal amplifier so as to be suited for the selected current mirror circuit 7, 8 or 9 (hereafter, the high-frequency superimposed current amplitude setting circuit 14 is simply referred to as the amplitude setting circuit 14). In the laser diode driving apparatus 27 according to Embodiment 1, the selected laser diode 1, 2 or 3 is driven using the high-frequency superimposed current in which the high-frequency signal is superimposed on the DC current, the high-frequency superimposed current being output from the corresponding current mirror circuit 7, 8 or 9.

The amplitude setting circuit 14 in the laser diode driving apparatus 27 according to Embodiment 1 comprises a reference voltage source 15; an operational amplifier 17 for transmitting the reference voltage supplied from the reference voltage source 15; a MOS transistor 100 for outputting a current obtained by converting the voltage transmitted from the operational amplifier 17; multiple selection switches 18, 19 and 20 being switched so as to be suited for the selected laser diode 1, 2 or 3; internal loads 21, 22 and 23 connected in series with the multiple selection switches 18, 19 and 20, respectively; and a D/A converter 16 operating by using the current output from the MOS transistor 100 as a reference current. The D/A converter 16 is controlled by a controller 13 and used to set the amplitude of the high-frequency superimposed current. In addition, the laser diode driving apparatus 27 according to Embodiment 1 is provided with an amplitude adjusting resistor 26 connected externally to an amplitude adjusting terminal 25. The amplitude adjusting terminal 25 is connected to the inverting input terminal (−) of the operational amplifier 17 via the multiple selection switches 18, 19 and 20 and the internal loads 21, 22 and 23 respectively corresponding thereto. Furthermore, the inverting input terminal (−) of the operational amplifier 17 is connected to the source terminal of the MOS transistor 100. The output of the operational amplifier 17 is input to the gate terminal of the MOS transistor 100. The reference voltage of the reference voltage source 15 is input to the non-inverting input terminal (+) of the operational amplifier 17. Moreover, the drain terminal of the MOS transistor 100 is connected to the D/A converter 16, and the reference current is input to the D/A converter 16.

Next, the operation of an optical disc recording/reproducing apparatus incorporating the laser diode driving apparatus 27 according to Embodiment 1 configured as described above will be described below.

In the reproduction mode of the optical disc recording/reproducing apparatus, the DC current is supplied from the DC current supply source 10 to the current mirror circuit 7, 8 or 9 suited for the recording medium. In the current mirror circuit 7, 8 or 9, the high-frequency signal supplied from the high-frequency signal amplifier 12 is superimposed on the DC current supplied from the DC current supply source 10. In the descriptions given below, a current obtained by superimposing the high-frequency signal on the DC current is referred to as a high-frequency superimposed current. The laser diode 1, 2 or 3 is driven using the high-frequency superimposed current being output via an output terminal 4, 5 or 6 from the current mirror circuit 7, 8 or 9, respectively. As a result, the laser diode 1, 2 or 3 emits light, and information recorded on the recording medium is reproduced. The high-frequency signal being output from the high-frequency signal amplifier 12 is generated from the oscillator 11. The amplitude of the high-frequency signal being output from the high-frequency signal amplifier 12 is set by changing the gain of the high-frequency signal amplifier 12 depending on the output of the amplitude setting circuit 14.

The amplitude setting circuit 14 will be described below in detail.

In the amplitude setting circuit 14, the reference voltage of the reference voltage source 15 is input to the non-inverting input terminal (+) of the operational amplifier 17 and compared with the voltage input to the inverting input terminal (−). The output of the operational amplifier 17 is input to the gate terminal of the MOS transistor 100 and is eventually DC-transmitted and V/I-converted. When V/I conversion is performed at the operational amplifier 17 and the MOS transistor 100, one of the selection switches 18, 19 and 20 is turned ON using a selection signal 24 (select 1, select 2 or select 3) so as to be suited for the laser diode 1, 2 or 3 from which light is emitted. The reference voltage is V/I-converted into a desired current using the operational amplifier 17 and the MOS transistor 100 via the internal load 21, 22 or 23 connected to the selection switch 18, 19 or 20 being in the ON state and the amplitude adjusting resistor 26 connected to the amplitude adjusting terminal 25. The current generated by the V/I conversion is input to the D/A converter 16 and serves as the reference current of the D/A converter 16. By the use of the reference current, the digital signal transmitted from the controller 13 is converted into an analog current by the D/A converter 16.

As an example of the D/A converter 16, the configuration of a 4-bit current addition type D/A converter 16 will be described below. FIG. 2 is a circuit diagram showing the configuration of the 4-bit current addition type D/A converter 16.

As shown in FIG. 2, the D/A converter 16 is formed of a current mirror circuit that assigns weights I1×1, I1×2, I1×4 and I1×8 for respective data bits. Herein, I1 designates the reference current being input from the MOS transistor 100. The reference current I1 being input from the MOS transistor 100 is input to the input terminal 119 of the D/A converter 16. Setting currents corresponding to D/A converter setting values D0, D1, D2 and D3 from the controller 13 are output from the output terminal 118. Switches 108, 109, 110 and 111 are connected to the MOS transistors 102, 103, 104 and 105, respectively, on the output side of the current mirror circuit in which the weights are assigned. The switches 108, 109, 110 and 111 are driven ON/OFF using D/A converter setting values D0, D1, D2 and D3 that are input from the controller 13. In addition, the MOS transistors 102, 103, 104 and 105 are connected to the output terminal 118 via the switches 108, 109, 110 and 111, respectively.

Next, the reproducing operation of the laser diode driving apparatus 27 according to Embodiment 1 will be described below.

First, an example of the relationship between the driving current and the light-emitting power of the laser diode shown in FIG. 3 is described before the description of the reproducing operation. FIG. 3 is a characteristic graph showing the relationship between the driving current and the light-emitting power of the laser diode according to Embodiment 1. In FIG. 3, the horizontal axis thereof represents a laser diode driving current [mA], and the vertical axis thereof represents a laser diode light-emitting power [mW].

Usually, the laser diode does not emit light until the laser diode driving current exceeds a predetermined threshold value A as shown in the characteristic graph of FIG. 3. In addition, when the laser diode is driven by a current exceeding the threshold value A, the light-emitting power increases in proportion to the laser diode driving current until a predetermined light-emitting power level is reached. In the laser diode driving apparatus 27 according to Embodiment 1, as shown in FIG. 3, the laser driver thereof is driven by a DC current until the laser diode driving current reaches the vicinity of the threshold value A, and then driven by a high-frequency superimposed current obtained by superimposing the high-frequency signal on the DC current, whereby the laser diode emits light. As a result, the laser diode driving apparatus 27 can generate the reproduction signal of the information recorded on the recording medium for which the laser diode is suited.

The laser diode driving apparatus 27 according to Embodiment 1 has a configuration that determines the reference current of the D/A converter 16 using the internal loads 21, 22 and 23 and the external load (the amplitude adjusting resistor 26). The D/A converter 16 being used herein has the configuration shown in FIG. 2. The selection switch 18, 19 or 20 corresponding to the laser diode 1, 2 or 3 being used to reproduce the information recorded on the recording medium is turned ON, and the internal load 21, 22 or 23 corresponding thereto is selected. The setting range of high-frequency superimposed current amplitude B (see FIG. 3) can be changed using the internal load selected in this way and the external load. In addition, the setting of the high-frequency superimposed current amplitude B is controlled by the controller 13.

As described above, the setting range of the high-frequency superimposed current amplitude B can be changed using the impedance of the selected internal load and the external load, and the high-frequency superimposed current amplitude B can be changed by the controller 13.

FIG. 4 is a characteristic graph showing an example of the relationship between D/A converter setting value C [dec] given by the controller 13 and the high-frequency superimposed current amplitude B [mApp]. In FIG. 4, the horizontal axis thereof represents the D/A converter setting value C (dec) of the D/A converter 16, the value having been set. The vertical axis thereof represents the high-frequency superimposed current amplitude B.

As shown in FIG. 4, in the laser diode driving apparatus 27 according to Embodiment 1, the inclination (resolution) of the straight line indicating the high-frequency superimposed current amplitude characteristic can be changed using the amplitude adjusting resistor 26 serving as an external load. Hence, the setting range of the high-frequency superimposed current amplitude B using the amplitude adjusting resistor 26 serving as an external load differs depending on the magnitude of the output current of the D/A converter 16. In other words, the setting range of the high-frequency superimposed current amplitude B using the amplitude adjusting resistor 26 is narrow when the D/A converter setting value C is small, and the setting range is wide when the D/A converter setting value C is large. As described above, in the laser diode driving apparatus 27 according to Embodiment 1, the high-frequency superimposed current amplitude B can be set using the output of the controller 13 and the amplitude adjusting resistor 26 serving as an external load. In the laser diode driving apparatus 27 according to Embodiment 1 configured as described above, the high-frequency superimposed current amplitude B can thus be set as desired.

The internal loads 21, 22 and 23 should only be formed of impedance elements having resistance components, such as resistors, diodes and MOS transistors.

Figure 5:
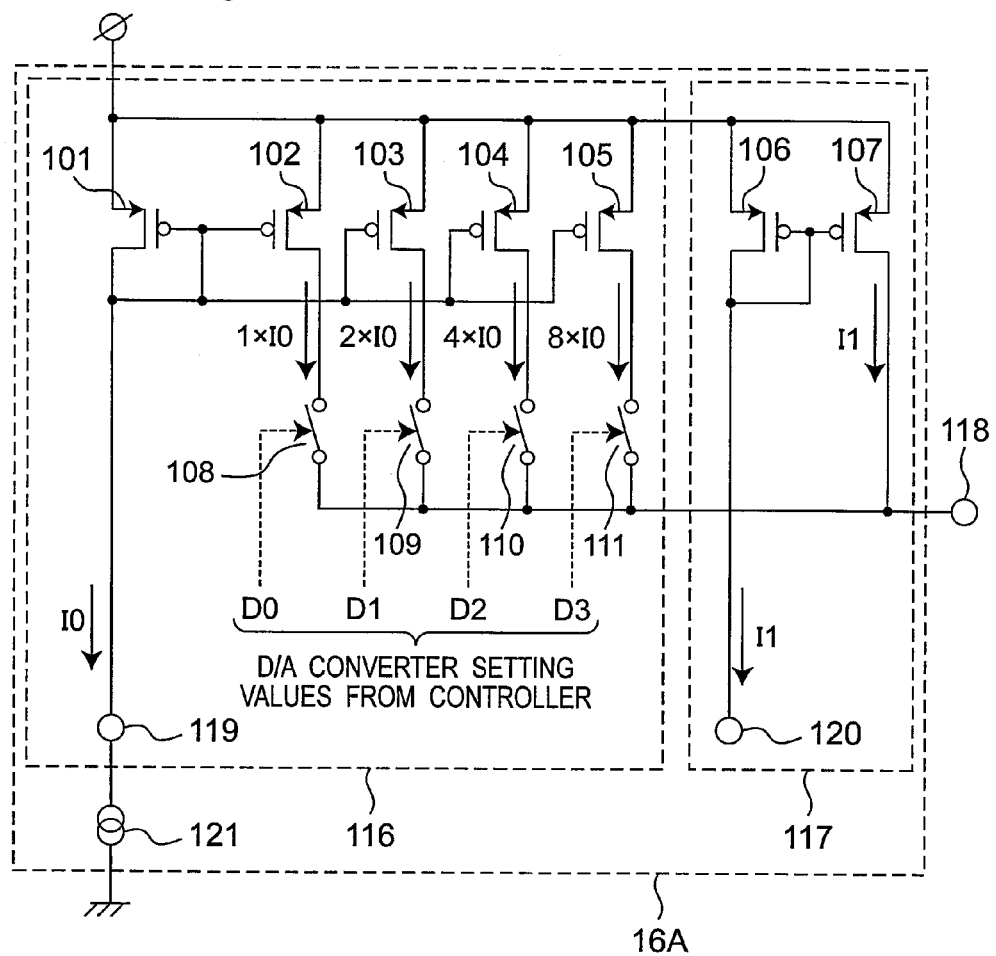
FIG. 5 is a circuit diagram showing another configuration of the D/A converter in the laser diode driving apparatus according to Embodiment 1.

Next, a case in which a 4-bit current addition type D/A converter having another configuration is used as the D/A converter 16 will be described below. FIG. 5 shows another configuration of the D/A converter in the laser diode driving apparatus according to Embodiment 1 and is a circuit diagram showing the configuration of the 4-bit current addition type D/A converter. The D/A converter 16A shown in FIG. 5 has a configuration in which a current mirror circuit 117 is added to the D/A converter 16 shown in FIG. 2 and a constant-current mirror circuit 121 for outputting a constant current I0 is connected to the input terminal 119. The MOS transistor 107 of the current mirror circuit 117 is connected to the output terminal 118. The reference current I1 from the MOS transistor 100 is input to the input terminal 120 of the current mirror circuit 117. In other words, the D/A converter 16A shown in FIG. 5 comprises a first current mirror circuit 116 in which weights I0×1, I0×2, I0×4 and I0×8 are assigned; the second mirror circuit 117; and the constant-current mirror circuit 121 connected to the input terminal 119. The operation of the first current mirror circuit 116 serving as a current source in which weights are assigned is similar to the operation of the D/A converter 16 shown in FIG. 2.

Figure 6:
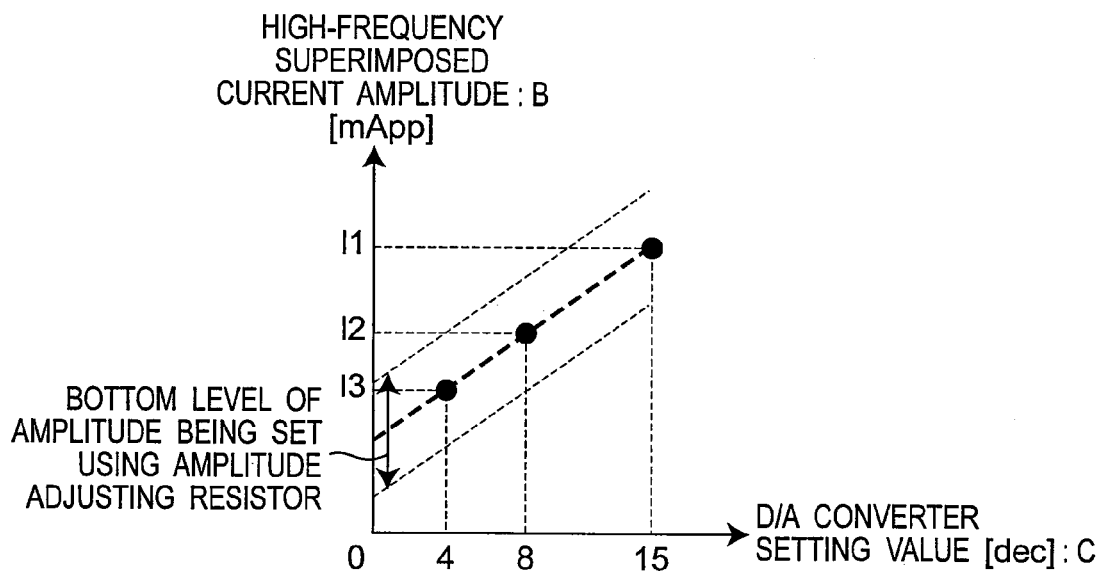
FIG. 6 is a graph showing the amplitude characteristic of the high-frequency superimposed current in the laser diode driving apparatus according to Embodiment 1 having a configuration other than that shown in FIG. 5.

FIG. 6 is a graph showing the amplitude characteristic in the case that the D/A converter 16A shown in FIG. 5 is incorporated in the laser diode driving apparatus according to Embodiment 1. FIG. 6 shows the amplitude characteristic of the high-frequency superimposed current of the laser diode driving apparatus according to Embodiment 1 being configured as shown in FIG. 5, and is a characteristic graph showing an example of the relationship between the D/A converter setting value C [dec] given by the controller 13 and the high-frequency superimposed current amplitude B [mApp]. In FIG. 6, the horizontal axis thereof represents the D/A converter setting value C (dec) of the D/A converter 16A, the value having been set. The vertical axis thereof represents the high-frequency superimposed current amplitude B.

As shown in FIG. 6, in the laser diode driving apparatus according to Embodiment 1 having another configuration, the reference current I1 is input to the input terminal 120, and the D/A converter setting value C is input from the controller 13, whereby the high-frequency superimposed current amplitude can be adjusted to have a desired value. By the use of the D/A converter 16A shown in FIG. 5, the bottom level of the high-frequency superimposed current amplitude B can be changed using the amplitude adjusting resistor 26 serving as an external load. Hence, the bottom level of the high-frequency superimposed current amplitude B indicated by a straight characteristic line can be changed without changing the inclination (resolution) of the straight characteristic line, instead of changing the inclination (resolution) of the straight characteristic line of the D/A converter 16 using the amplitude adjusting resistor 26 connected externally as shown in FIG. 4.

Embodiment 2

Figure 7:
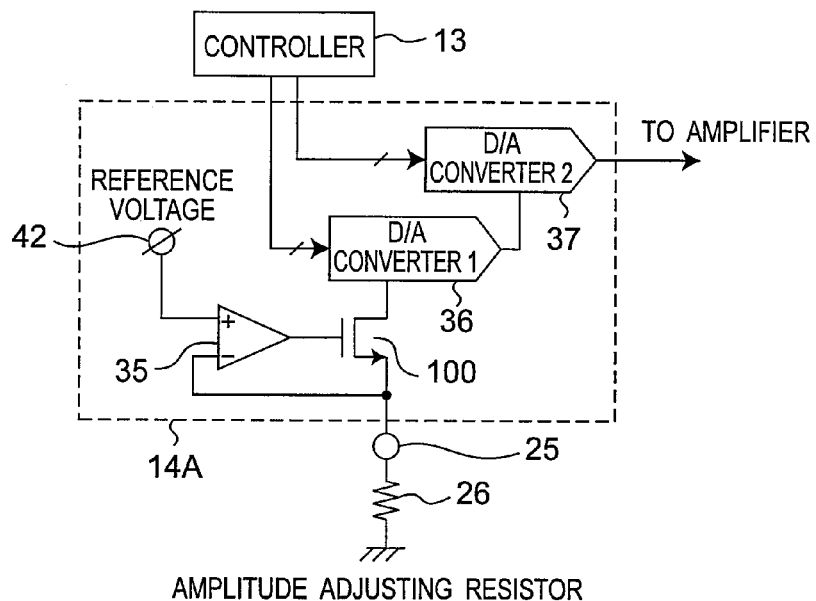
FIG. 7 is a circuit diagram showing the high-frequency superimposed current amplitude circuit in the laser diode driving apparatus according to Embodiment 2 of the present invention.

A laser diode driving apparatus according to Embodiment 2 of the present invention will be described below using FIG. 7. FIG. 7 is a circuit diagram showing the high-frequency superimposed current amplitude setting circuit in the laser diode driving apparatus according to Embodiment 2. The laser diode driving apparatus according to Embodiment 2 is used for optical disc recording/reproducing apparatuses in a way similar to that of the laser diode driving apparatus according to Embodiment 1 described above, and the configuration thereof is the same as that of the laser diode driving apparatus according to Embodiment 1, except for the high-frequency superimposed current amplitude setting circuit.

As shown in FIG. 7, the high-frequency superimposed current amplitude setting circuit 14A of the laser diode driving apparatus according to Embodiment 2 has a configuration in which two D/A converters 36 and 37 are controlled by the controller 13 to set the high-frequency superimposed current amplitude. The D/A converters 36 and 37 have the configuration shown in FIG. 2 as in the case of Embodiment 1. The selection switches (18, 19 and 20) and the internal loads (21, 22 and 23) being used in Embodiment 1 are not provided for the laser diode driving apparatus according to Embodiment 2. The reference current of the second D/A converter 37 whose output is output to the high-frequency signal amplifier is the output current of the first D/A converter 36. The reference current of the first D/A converter 36 is the output current of the MOS transistor 100. The reference voltage of a reference voltage source 42 is input to the non-inverting input terminal (+) of an operational amplifier 35 and DC-transmitted. The gate terminal of the MOS transistor 100 is connected to the output terminal of the operational amplifier 35. To the inverting input terminal (−) of the operational amplifier 35, the source terminal of the MOS transistor 100 is connected, and the amplitude adjusting resistor 26 is also connected thereto via the amplitude adjusting terminal 25. In the MOS transistor 100 connected as described above, a current that is adjusted and V/I-converted using the amplitude adjusting resistor 26 is output.

The laser diode driving apparatus according to Embodiment 2 is most different from the laser diode driving apparatus according to Embodiment 1 described above in that the output current generated using the first D/A converter 36 is used as the reference current of the second D/A converter 37 whose output is output to the high-frequency signal amplifier. In the laser diode driving apparatus according to Embodiment 2, the current that is V/I-converted using the operational amplifier 35 and the MOS transistor 100 via the amplitude adjusting resistor 26 is set in two steps, whereby the setting range of the high-frequency superimposed current amplitude is wider and the setting can be done more accurately. Hence, highly accurate setting can be attained easily even in the configuration of the laser diode driving apparatus according to Embodiment 2 not requiring the selection switches (18, 19 and 20) and the internal loads (21, 22 and 23).

Embodiment 3

Figure 8:
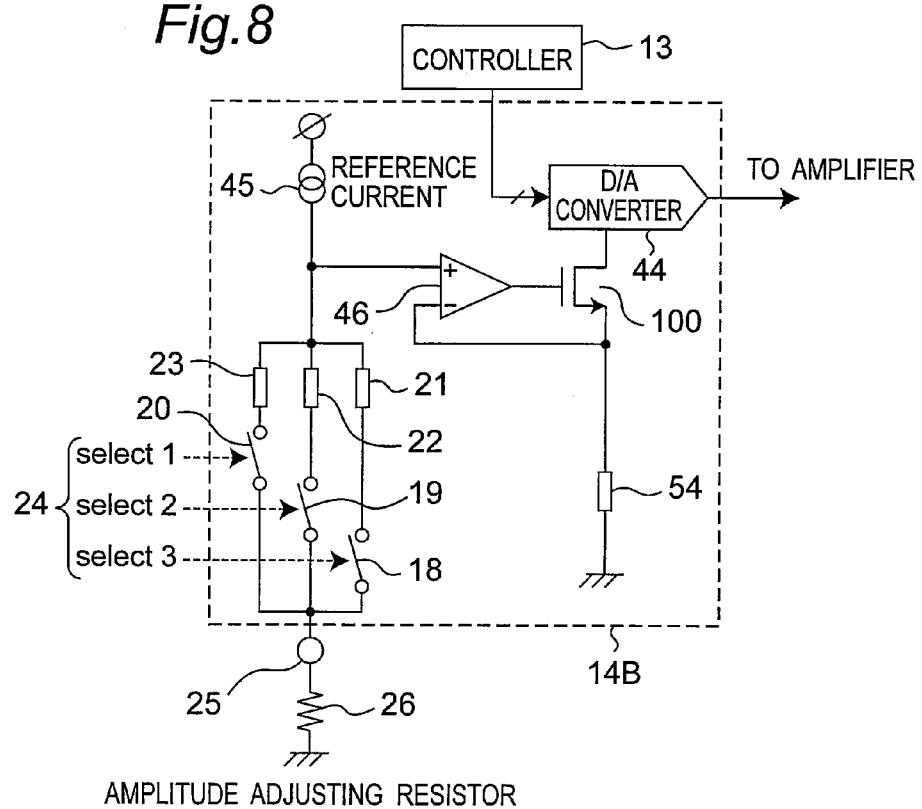
FIG. 8 is a circuit diagram showing the high-frequency superimposed current amplitude circuit in the laser diode driving apparatus according to Embodiment 3 of the present invention.

A laser diode driving apparatus according to Embodiment 3 of the present invention will be described below using FIG. 8. FIG. 8 is a circuit diagram showing the high-frequency superimposed current amplitude setting circuit in the laser diode driving apparatus according to Embodiment 3. The laser diode driving apparatus according to Embodiment 3 is used for optical disc recording/reproducing apparatuses in a way similar to that of the laser diode driving apparatus according to Embodiment 1 described above, and the configuration thereof is the same as that of the laser diode driving apparatus according to Embodiment 1, except for the high-frequency superimposed current amplitude setting circuit.

As shown in FIG. 8, the high-frequency superimposed current amplitude setting circuit 14B (hereafter, the high-frequency superimposed current amplitude setting circuit 14B is simply referred to as the amplitude setting circuit 14B) in the laser diode driving apparatus according to Embodiment 3 is provided with a reference current source 45, and the output of the reference voltage source 45 is input to the non-inverting input terminal (+) of an operational amplifier 46. In addition, the amplitude adjusting resistor 26 serving as an external load is connected to the amplitude setting circuit 14B via the amplitude adjusting terminal 25. The amplitude adjusting terminal 25 is connected to the non-inverting input terminal (+) of the operational amplifier 46 and the reference current source 45 via the selection switches 18, 19 and 20 and the internal loads 21, 22 and 23. The gate terminal of the MOS transistor 100 is connected to the output terminal of the operational amplifier 46. Furthermore, the source terminal of the MOS transistor 100 and a V/I conversion resistor 54 are connected to the inverting input terminal (−) of the operational amplifier 46.

In the laser diode driving apparatus according to Embodiment 3 shown in FIG. 8, the output of a D/A converter 44 controlled by the controller 13 is input to the high-frequency signal amplifier. The reference current of the D/A converter 44 is a current that is obtained by V/I-converting the voltage input to the non-inverting input terminal (+) using the operational amplifier 46, the MOS transistor 100 and the V/I conversion resistor 54. The voltage before the V/I conversion is generated from the reference current by the means described in Embodiment 1. The laser diode driving apparatus according to Embodiment 3 is most different from the laser diode driving apparatus according to Embodiment 1 in that the reference current from the reference current source 45 is output to the amplitude adjusting resistor 26. Since the reference current of the D/A converter 44 can be set in proportion to the resistance value of the amplitude adjusting resistor 26 in Embodiment 3 as described above, the setting range of the high-frequency superimposed current amplitude can also be set similarly in proportion to the resistance value of the amplitude adjusting resistor 26.

In the laser diode driving apparatus according to Embodiment 3, the selection switch 18, 19 or 20 and the internal load 21, 22 or 23 are used as voltage converting means for carrying out voltage conversion so as to be suited for the selected laser diode 1, 2 or 3.

Embodiment 4

Figure 9:
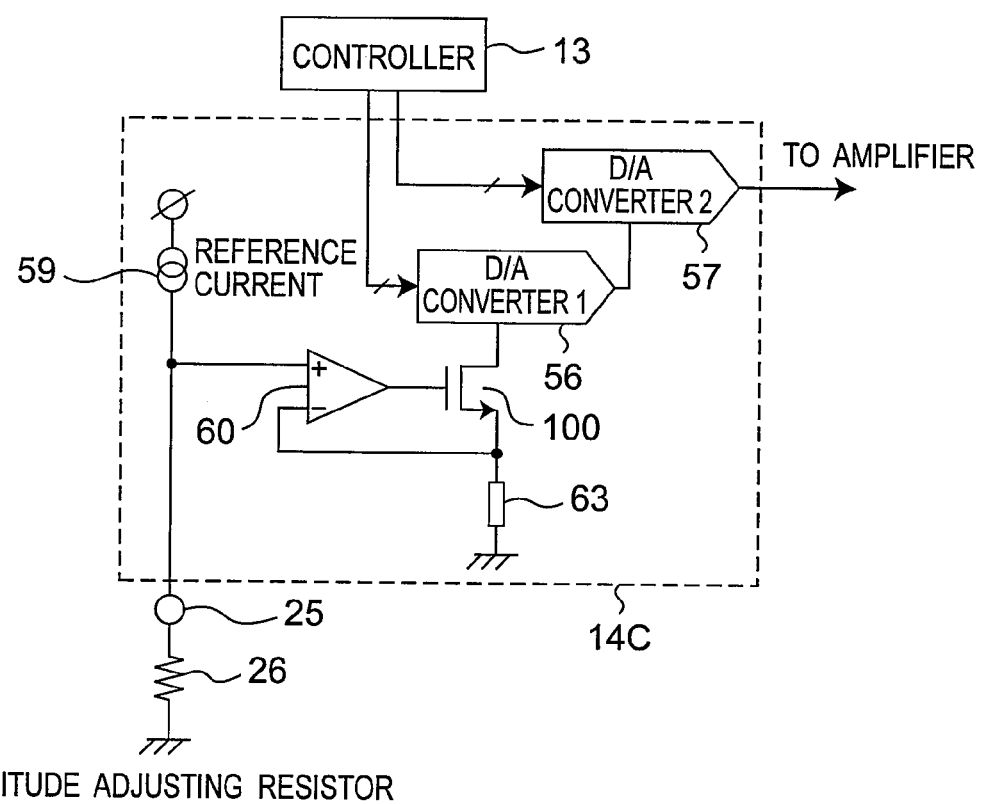
FIG. 9 is a circuit diagram showing the high-frequency superimposed current amplitude circuit in the laser diode driving apparatus according to Embodiment 4 of the present invention.

A laser diode driving apparatus according to Embodiment 4 of the present invention will be described below using FIG. 9. FIG. 9 is a circuit diagram showing the high-frequency superimposed current amplitude setting circuit in the laser diode driving apparatus according to Embodiment 4. The laser diode driving apparatus according to Embodiment 4 is used for optical disc recording/reproducing apparatuses in a way similar to that of the laser diode driving apparatus according to Embodiment 1 described above, and the configuration thereof is the same as that of the laser diode driving apparatus according to Embodiment 1, except for the high-frequency superimposed current amplitude setting circuit.

As shown in FIG. 9, the high-frequency superimposed current amplitude setting circuit 14C in the laser diode driving apparatus according to Embodiment 4 has a configuration in which two D/A converters 56 and 57 are controlled by the controller 13 to set the high-frequency superimposed current amplitude. In addition, a reference current source 59 is used instead of the reference voltage source. The output of the reference current source 59 is input to the non-inverting input terminal (+) of an operational amplifier 60 and DC-transmitted.

In the laser diode driving apparatus according to Embodiment 4, the reference current of the second D/A converter 57 whose output is output to the high-frequency signal amplifier is the output current of the first D/A converter 56. The reference current from the reference current source 59 is voltage-converted using the amplitude adjusting resistor 26 serving as an external load. The voltage obtained by the voltage conversion using the amplitude adjusting resistor 26 is DC-transmitted using the operational amplifier 60 and the MOS transistor 100, and converted into a current using a V/I conversion resistor 63. The current obtained by the current conversion is input so as to serve as the reference current of the first D/A converter 56.

The configuration of the laser diode driving apparatus according to Embodiment 4 is basically the same as that of the laser diode driving apparatus according to Embodiment 2 described above. The laser diode driving apparatus according to Embodiment 4 differs from the laser diode driving apparatus according to Embodiment 2 depending on whether the output to the amplitude adjusting terminal 25 is a current or a voltage. Since the laser diode driving apparatus according to Embodiment 4 is configured as described above, the apparatus can obtain effects of both of Embodiment 2 and Embodiment 3.

Like the laser diode driving apparatus according to Embodiment 2 described above, the laser diode driving apparatus according to Embodiment 4 is not provided with the selection switches (18, 19 and 20) and the internal loads (21, 22 and 23) being used in Embodiment 1. Hence, the configuration is simplified and requires less number of components. Although the laser diode driving apparatus according to Embodiment 4 has the configuration described above, highly accurate setting can be done easily.

Embodiment 5

Figure 10:
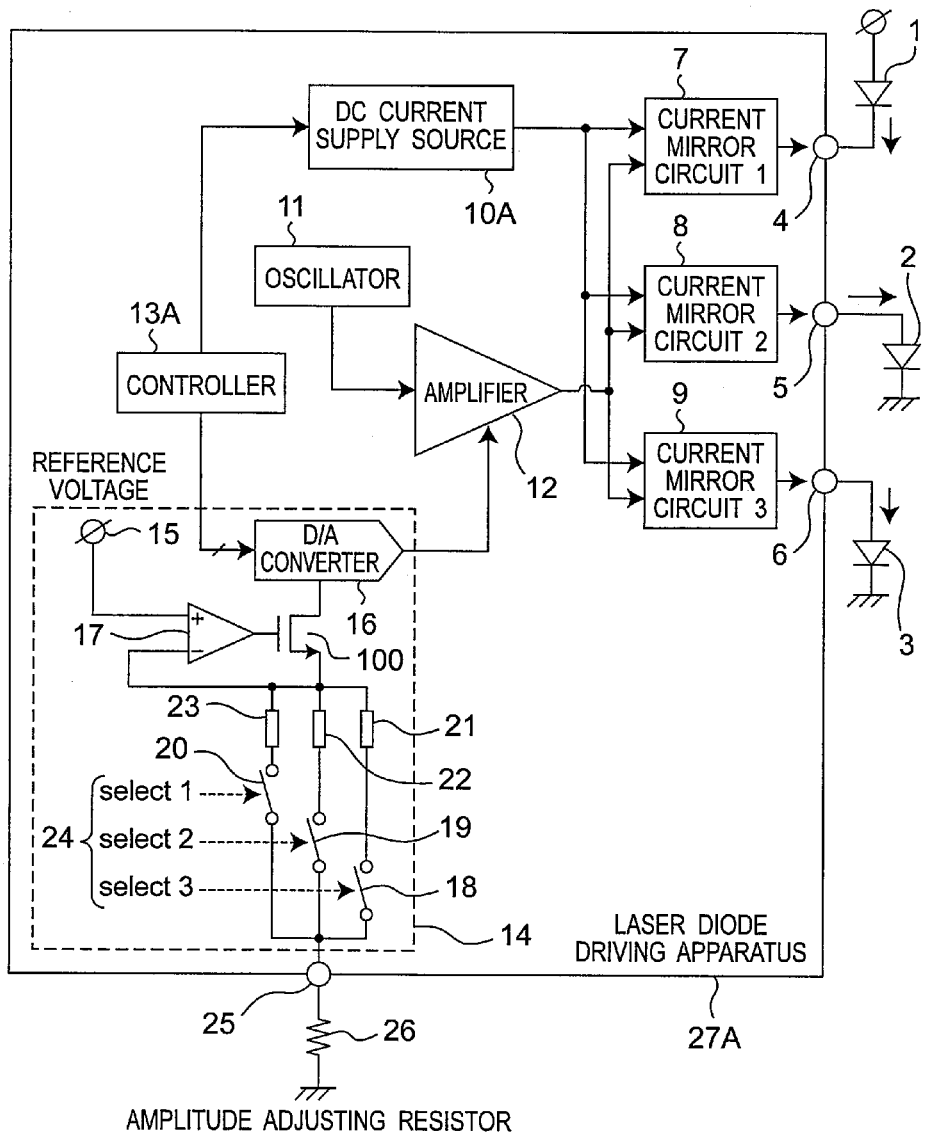
FIG. 10 is a circuit diagram showing the configuration of the laser diode driving apparatus according to Embodiment 5 of the present invention.
Figure 11:
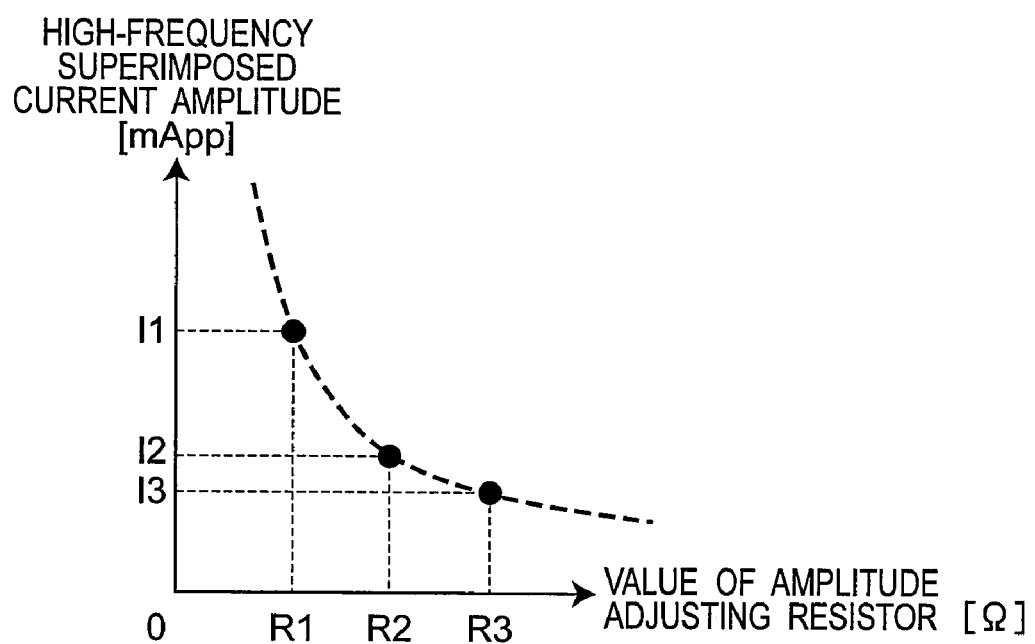
FIG. 11 is a characteristic graph showing an example of the relationship between the amplitude of the high-frequency superimposed current and the value of the amplitude adjusting resistor in the conventional laser diode driving apparatus.

A laser diode driving apparatus according to Embodiment 5 of the present invention will be described below using FIG. 10. FIG. 10 is a circuit diagram showing the configuration of a laser diode driving apparatus 27A according to Embodiment 5. As shown in FIG. 10, in the laser diode driving apparatus 27A according to Embodiment 5, a signal line connected between the controller 13 and the DC current supply source 10 is added to the laser diode driving apparatus 27 according to Embodiment 1 shown in FIG. 1 described above. The laser diode driving apparatus 27A according to Embodiment 5 has a configuration obtained by further improving the configuration of the laser diode driving apparatus 27 according to Embodiment 1 described above.

In the laser diode driving apparatus 27 according to Embodiment 1 described above, the configuration in which the high-frequency superimposed current amplitude is set by adjusting the gain of the high-frequency signal amplifier 12 so as to be suited for the laser diode 1, 2 or 3 is described. The laser diode driving apparatus 27A according to Embodiment 5 has a configuration in which the gain of the high-frequency signal amplifier 12 is adjusted so as to be suited for the laser diode 1, 2 or 3, and the DC current that is supplied from the DC current supply source 10A to the current mirror circuit 7, 8 or 9 can be set to a desired value suited for the laser diode 1, 2 or 3 on the basis of the signal from the controller 13A. With this configuration, the laser diode driving apparatus 27A according to Embodiment 5 can generate a high-frequency superimposed current being more reliable and suited for the respective laser diodes 1, 2 and 3.

Although the configuration in which the signal line connected between the controller 13 and the DC current supply source 10 is added to the laser diode driving apparatus 27 according to Embodiment 1 is shown in FIG. 10, a configuration in which the signal line connected between the controller and the DC current supply source is added so as to transmit a signal for designating the selected laser diode from the controller to the DC current supply source can also be used for Embodiments 2 to 4 described above.

As described above, the laser diode driving apparatus according to Embodiment 5 has a configuration obtained by further improving the configuration of the laser diode driving apparatus according to Embodiment 4. Hence, the laser diode driving apparatus according to Embodiment 5 can generate a high-frequency superimposed current being more reliable and suited for the selected laser diode.

In an optical disc recording/reproducing apparatus incorporating an optical pickup, the laser diode driving apparatus according to the present invention is useful as an apparatus for attaining reproduction performance capable of being flexibly suited for the characteristics of other components on the optical pickup.

Although the present invention has been described with respect to its preferred embodiments in some detail, the disclosed contents of the preferred embodiments may change in the details of the structure thereof, and any changes in the combination and sequence of the component may be attained without departing from the scope and spirit of the claimed invention.

What is claimed is:

1. A laser diode driving apparatus comprising an oscillator for generating a high-frequency signal; an amplifier for receiving said high-frequency signal; current mirror circuits for receiving the output of said amplifier and driving respective multiple laser diodes; a DC current supply source for supplying a DC current to said current mirror circuits; a high-frequency superimposed current amplitude setting circuit for changing the amplitude of said amplifier so as to be suited for the selected current mirror circuit; and a controller for controlling said high-frequency superimposed current amplitude setting circuit, wherein said laser diode is driven using a current obtained by superimposing said high-frequency signal on said DC current;

said high-frequency superimposed current amplitude setting circuit is provided with a D/A converter that outputs a current for changing the amplitude of said amplifier, and the output current of said D/A converter is changed so as to be suited for said laser diode, and the amplitude signal from said amplifier is superimposed on said DC current supplied from said DC current supply source in said current mirror circuit to generate a high-frequency superimposed current, and the selected laser diode is driven using the generated high-frequency superimposed current.

2. A laser diode driving apparatus comprising an oscillator for generating a high-frequency signal; an amplifier for receiving said high-frequency signal; current mirror circuits for receiving the output of said amplifier and driving respective multiple laser diodes; a DC current supply source for supplying a DC current to said current mirror circuits; a high-frequency superimposed current amplitude setting circuit for changing the amplitude of said amplifier so as to be suited for the selected current mirror circuit; and a controller for controlling said high-frequency superimposed current amplitude setting circuit, wherein said laser diode is driven using a current obtained by superimposing said high-frequency signal on said DC current;

said high-frequency superimposed current amplitude setting circuit is provided with a D/A converter that outputs a current for changing the amplitude of said amplifier, and the output current of said D/A converter is chanced so as to be suited for said laser diode, wherein said high-frequency superimposed current amplitude setting circuit comprises a reference voltage source; an operational amplifier for transmitting the reference voltage supplied from said reference voltage source; a MOS transistor for outputting a current obtained by converting the voltage transmitted from said operational amplifier; multiple selection switches being switched corresponding to the selected laser diode; internal loads respectively connected in series with said multiple selection switches; and a D/A converter operating by using the current being output from said MOS transistor as a reference current to output a current for changing the amplitude of said amplifier.

3. The laser diode driving apparatus according to claim 2, wherein said selection switch corresponding to the selected laser diode is driven, and the reference voltage being input to said operational amplifier is V/I-converted into a current suited for the selected laser diode using an external load and the internal load driven by said selection switch.

4. The laser diode driving apparatus according to claim 2, wherein the inclination of the straight line indicating the high-frequency superimposed current amplitude characteristic is changed using an external load.

5. The laser diode driving apparatus according to claim 2, wherein the bottom level of the straight line indicating the high-frequency superimposed current amplitude characteristic is changed using an external load.

6. The laser diode driving apparatus according to claim 2, wherein said high-frequency superimposed current amplitude setting circuit comprises multiple D/A converters, the output current of the D/A converter of the former stage is input so as to serve as the reference current of the D/A converter of the next stage, and the output of the D/A converter of the last stage is input to said amplifier.

7. A laser diode driving apparatus comprising an oscillator for generating a high-frequency signal; an amplifier for receiving said high-frequency signal; current mirror circuits for receiving the output of said amplifier and driving respective multiple laser diodes; a DC current supply source for supplying a DC current to said current mirror circuits; a high-frequency superimposed current amplitude setting circuit for changing the amplitude of said amplifier so as to be suited for the selected current mirror circuit; and a controller for controlling said high-frequency superimposed current amplitude setting circuit, wherein said laser diode is driven using a current obtained by superimposing said high-frequency signal on said DC current;

said high-frequency superimposed current amplitude setting circuit is provided with a D/A converter that outputs a current for changing the amplitude of said amplifier, and the output current of said D/A converter is chanced so as to be suited for said laser diode, wherein said high-frequency superimposed current amplitude setting circuit comprises a reference current source; voltage converting means for converting the reference current supplied from said reference current source into a voltage suited for the selected laser diode; an operational amplifier to which the output of said voltage converting means is input; a MOS transistor for outputting a current obtained by converting the voltage transmitted from said operational amplifier; and a D/A converter operating by using the current being output from said MOS transistor as a reference current to change the amplitude of said amplifier.

8. A laser diode driving apparatus comprising an oscillator for generating a high-frequency signal; an amplifier for receiving said high-frequency signal; current mirror circuits for receiving the output of said amplifier and driving respective multiple laser diodes; a DC current supply source for supplying a DC current to said current mirror circuits; a high-frequency superimposed current amplitude setting circuit for changing the amplitude of said amplifier so as to be suited for the selected current mirror circuit; and a controller for controlling said high-frequency superimposed current amplitude setting circuit, wherein said laser diode is driven using a current obtained by superimposing said high-frequency signal on said DC current;

said high-frequency superimposed current amplitude setting circuit is provided with a D/A converter that outputs a current for changing the amplitude of said amplifier, and the output current of said D/A converter is chanced so as to be suited for said laser diode, wherein said high-frequency superimposed current amplitude setting circuit comprises a reference current source; an operational amplifier to which a voltage obtained by converting the reference current supplied from said reference current source is input; a MOS transistor for outputting a current obtained by converting the voltage transmitted from said operational amplifier; a first D/A converter to which the current being output from said MOS transistor is input as a first reference current; and a second D/A converter to which the output of said first D/A converter is input as a second reference current, and the output of said second D/A converter is input to said amplifier.

* * * * *